(12) United States Patent
Michel et al.

(10) Patent No.: US 11,940,059 B2
(45) Date of Patent: Mar. 26, 2024

(54) METHOD FOR DETERMINING A SWITCHING STATE OF A VALVE, AND SOLENOID VALVE ASSEMBLY

(71) Applicant: Continental Teves AG & Co. oHG, Frankfurt am Main (DE)

(72) Inventors: Alexander Michel, Frankfurt am Main (DE); Dirk Morschel, Frankfurt am Main (DE); Eduard Wiens, Frankfurt am Main (DE)

(73) Assignee: CONTINENTAL TEVES AG & CO. OHG, Frankfurt am Main (DE)

( * ) Notice: Subject to any disclaimer, the term of this patent is extended or adjusted under 35 U.S.C. 154(b) by 395 days.

(21) Appl. No.: 17/284,920

(22) PCT Filed: Oct. 9, 2019

(86) PCT No.: PCT/EP2019/077400
§ 371 (c)(1),
(2) Date: Apr. 13, 2021

(87) PCT Pub. No.: WO2020/078806
PCT Pub. Date: Apr. 23, 2020

(65) Prior Publication Data
US 2021/0381620 A1    Dec. 9, 2021

(30) Foreign Application Priority Data
Oct. 15, 2018   (DE) ............... 10 2018 217 661.2

(51) Int. Cl.
*G01R 35/00*   (2006.01)
*F16K 31/06*   (2006.01)
(Continued)

(52) U.S. Cl.
CPC ...... *F16K 37/0083* (2013.01); *F16K 31/0675* (2013.01); *G01R 33/0035* (2013.01);
(Continued)

(58) Field of Classification Search
CPC ............. F16K 37/0083; F16K 31/0675; H01F 2007/1861; H01F 2007/1888;
(Continued)

(56) References Cited

U.S. PATENT DOCUMENTS 6,541,961 B1   4/2003   Max
8,055,460 B2   11/2011  Rajagopalan et al.
(Continued)

FOREIGN PATENT DOCUMENTS

DE   19836769 C1   4/2000
DE   19910497 A1   9/2000
(Continued)

OTHER PUBLICATIONS

European Examination Report for European Application No. 19 786 939.9, dated Feb. 9, 2023 with translation, 6 pages.
(Continued)

*Primary Examiner* — Raul J Rios Russo
(74) *Attorney, Agent, or Firm* — BUCHANAN INGERSOLL & ROONEY PC

(57) ABSTRACT

A method for determining a switching state of a valve, an inductance variable being determined on the basis of current and voltage measurements and the switching state being determined on the basis of the inductance variable. Also disclosed is a solenoid valve assembly for carrying out such a method.

13 Claims, 5 Drawing Sheets

(51) Int. Cl.
    *F16K 37/00*   (2006.01)
    *G01R 33/00*   (2006.01)
    *G01V 3/08*        (2006.01)
    *G01V 13/00*       (2006.01)
    *H01F 7/18*        (2006.01)
(52) U.S. Cl.
    CPC ........... *G01R 35/00* (2013.01); *G01R 35/005* (2013.01); *G01V 3/08* (2013.01); *G01V 3/081* (2013.01); *G01V 13/00* (2013.01); *H01F 2007/1861* (2013.01); *H01F 2007/1888* (2013.01)
(58) Field of Classification Search
    CPC . H01F 2007/185; H01F 7/1844; G01R 31/72; G01R 31/2829; G01R 33/0035; G01R 35/005; G01R 35/00; G01V 13/00; G01V 3/081; G01V 3/08
    USPC ...................... 324/51, 55, 74, 130, 200, 202
    See application file for complete search history.

(56) References Cited

U.S. PATENT DOCUMENTS

| | | | |
|---|---|---|---|
| 2018/0231143 A1 | 8/2018 | Ferrer Herrera et al. | |
| 2018/0268978 A1* | 9/2018 | Wang | G01R 31/3278 |
| 2020/0072892 A1* | 3/2020 | Madane | F15B 13/044 |
| 2021/0388921 A1* | 12/2021 | Maj | B60T 8/3655 |
| 2021/0404577 A1* | 12/2021 | Ferrarini | F16K 37/0083 |
| 2022/0034420 A1* | 2/2022 | Ott | G01F 11/029 |

FOREIGN PATENT DOCUMENTS

| | | |
|---|---|---|
| DE | 10034830 A1 | 2/2002 |
| DE | 102010007753 A1 | 9/2010 |
| DE | 102014216610 A1 | 2/2016 |
| EP | 1384976 A1 | 1/2004 |
| EP | 2998977 B1 | 3/2016 |

OTHER PUBLICATIONS

Chinese Office Action for Chinese Application No. 201980067490.8, dated May 11, 2023 with translation, 9 pages.
International Search Report and Written Opinion for International Application No. PCT/EP2019/077400, dated Dec. 18, 2019, with partial English translation, 7 pages.
International Search Report and Written Opinion for International Application No. PCT/EP2019/077400, dated Dec. 18, 2019, 12 pages (German).
German Search Report for German Application No. 10 2018 217 661.2, dated Nov. 11, 2019, with partial English translation, 13 pages.
German Examination Report for German Application No. 19 786 939.9, dated Jun. 13, 2023 with translation, 5 pages.
European Communication pursuant to Article 94(3) for European Application No. 19 786 939.9, dated Oct. 9, 2023 with translation, 7 pages.
Chinese Office Action for Chinese Application No. 201980067490.8, dated Sep. 28, 2023 with translation, 9 pages.

* cited by examiner

METHOD FOR DETERMINING A SWITCHING STATE OF A VALVE, AND SOLENOID VALVE ASSEMBLY

CROSS REFERENCE TO RELATED APPLICATIONS

This application is the U.S. National Phase Application of PCT International Application No. PCT/EP2019/077400, filed Oct. 9, 2019, which claims priority to German Patent Application No. 10 2018 217 661.2, filed Oct. 15, 2018, the contents of such applications being incorporated by reference herein.

FIELD OF THE INVENTION

The invention relates to a method for determining a switching state of a valve which is actuated by means of a coil. The invention also relates to a solenoid valve assembly which is designed to carry out such a method.

BACKGROUND OF THE INVENTION

Valves can be actuated in particular by means of electromagnets. Corresponding solenoid valve assemblies, which typically have a valve and a coil for actuating the valve, can be constructed for this.

According to the prior art, it is known to switch valves by way of applying to the respective coil a current which is suitable for switching. A magnetic field generated in this way typically switches the valve or keeps the valve in a specific state. However, in embodiments according to the prior art, it is typically assumed that a set or desired switching state is also actually assumed. A check is not provided.

SUMMARY OF THE INVENTION

Therefore, an aspect of the invention is a method for determining a switching state of a valve. A further aspect of the invention is an associated solenoid valve assembly.

An aspect of the invention relates to a method for determining a switching state of a valve which is actuated by means of a coil. The method comprises the following steps:
respectively ascertaining a current flowing through the coil and a voltage applied to the coil at several times following one another with a specified time interval,
calculating an inductance variable of the coil on the basis of the currents, the voltage and the time interval and
determining the switching state on the basis of the inductance variable.

An aspect of the invention is based on the knowledge that an inductance variable can be ascertained by measuring the currents and voltages at the times mentioned, wherein a switching state of the valve can be ascertained on the basis of this inductance variable. This allows monitoring of the switching state, that is to say for example whether the valve is open or closed.

Current and/or voltage may for example be ascertained by measurement. Suitable measuring devices can be used for this purpose. However, they may also each be ascertained by values being specified. This may be the case in particular when a value is specified and set by a device which is suitable for this purpose. For example, a regulated current source may therefore be used to set a defined current. The same applies to the voltage. In this case, it is no longer absolutely necessary to measure an actually set value, though it should be mentioned that such a value may nevertheless be measured.

An inductance in the physical sense can be used as the inductance variable. However, it is also possible to use a variable that is indicative of the inductance, for example is proportional to the actual inductance, but is easier to calculate or easier to handle. There is typically a relationship, for example a linear relationship, between the inductance variable and the actual inductance.

The inductance variable may in particular be calculated using the method of least squares. This has been found to be an efficient approach.

The method of least squares may preferably be used recursively with a forgetting factor. This can optimize the computing time required.

According to a preferred embodiment, the inductance variable may be ascertained by means of a linear equation. In the linear equation, a first column vector is set equal to a matrix multiplied by a second column vector.

The times may in particular be numbered with index k.

The first column vector may contain in row k a difference between the current at time k+1 minus the current at time k.

The matrix may in particular have two columns. The first column of the matrix may contain in row k a sum of the voltage at time k+1 and the voltage at time k. The second column of the matrix may contain in row k a sum of the current at time k+1 and the current at time k.

The second column vector may contain a first parameter in its first row and a second parameter in its second row.

Solving such an equation has been found to be an efficient and practicable way of ascertaining the inductance variable. The derivation will be discussed in more detail below.

The inductance variable or the inductance can be calculated as the quotient of the time interval divided by the number 2 and divided by the first parameter. This allows the inductance variable or inductance to be easily calculated on the basis of the aforementioned equation.

It should be noted that the inductance variable may be easier to determine than the inductance in the strictly physical sense, while the inductance variable or another variable that is easier to calculate than the inductance and is based on the inductance can also be used for determining the switching state.

According to one development, a resistance of the coil may also be calculated on the basis of the currents, the voltages and the time interval. Such a resistance may be used for further evaluations. It should be understood that, instead of the resistance, here too a resistance variable that has a relationship, for example a linear relationship, with the actual resistance may be specified. This is considered to be equivalent here.

A resistance of the coil may in particular be calculated as the quotient of the second parameter divided by the first parameter. This allows the resistance to be calculated easily.

The method can in particular be repeated continuously or continually. This means that the state of a valve can be continuously monitored.

According to a preferred embodiment, the inductance variable is compared with a first end value and a second end value. When the inductance variable is at most a predetermined distance from the first end value, a first switching state can be determined. When the inductance value is at most a predetermined distance from the second end value, a second switching state can be determined. This has proven to be a practicable and reliable way of determining a switching state. It is based in particular on the knowledge that, depending on the switching state, the inductance assumes different values, which can be compared.

The switching states may in particular be end states of the valve. However, it is also possible to ascertain intermediate states.

The switching state of a valve may also be detected from a test signal. This may be impressed on the coil, so that the switching state can be identified.

In particular, calculations may be carried out entirely or partly by means of fixed point arithmetic. Such fixed point arithmetic has proven to be particularly efficient for the present purposes.

According to one embodiment, the coil may be controlled by means of pulse width modulation. Current and voltage can then in particular each be averaged over a pulse width modulation period. It has been shown that in this case it is possible also to use the method in an advantageous manner for a coil which is controlled by means of pulse width modulation.

According to one embodiment, a first memory matrix is formed as the product of the transpose of the matrix and the first column vector. A second memory matrix may be formed as the inverse of a product of the transpose of the matrix and the matrix. The first memory matrix and the second memory matrix may then be stored. The first column vector and the matrix are, in particular in this case, preferably not stored as such. It has been shown that this leads to a simplified calculation.

The system of equations may in particular be solved in such a way that the second column vector is set equal to the product of the second memory matrix and the first memory matrix. This has proven to be an efficient calculation specification.

An aspect of the invention also relates to a solenoid valve assembly. This solenoid valve assembly has a valve and a coil for actuating the valve. It also has a control device for applying a current and/or a voltage to the coil. As a result, the valve or the coil can be actuated.

The solenoid valve assembly also has a state determination device which is designed to carry out a method according to an aspect of the invention. All of the embodiments and variants described herein can be used here.

By means of the solenoid valve assembly according to an aspect of the invention, the advantages mentioned further above can be made usable for a solenoid valve assembly.

An aspect of the invention also relates to a non-volatile, computer-readable storage medium on which program code is stored, during the execution of which a method according to an aspect of the invention is executed. With respect to the method according to an aspect of the invention, all of the embodiments and variants described herein can be used.

BRIEF DESCRIPTION OF THE DRAWINGS

A person skilled in the art will take further features and advantages from the exemplary embodiment described below with reference to the appended drawing, in which.

DETAILED DESCRIPTION OF THE PREFERRED EMBODIMENTS

Figure 1:
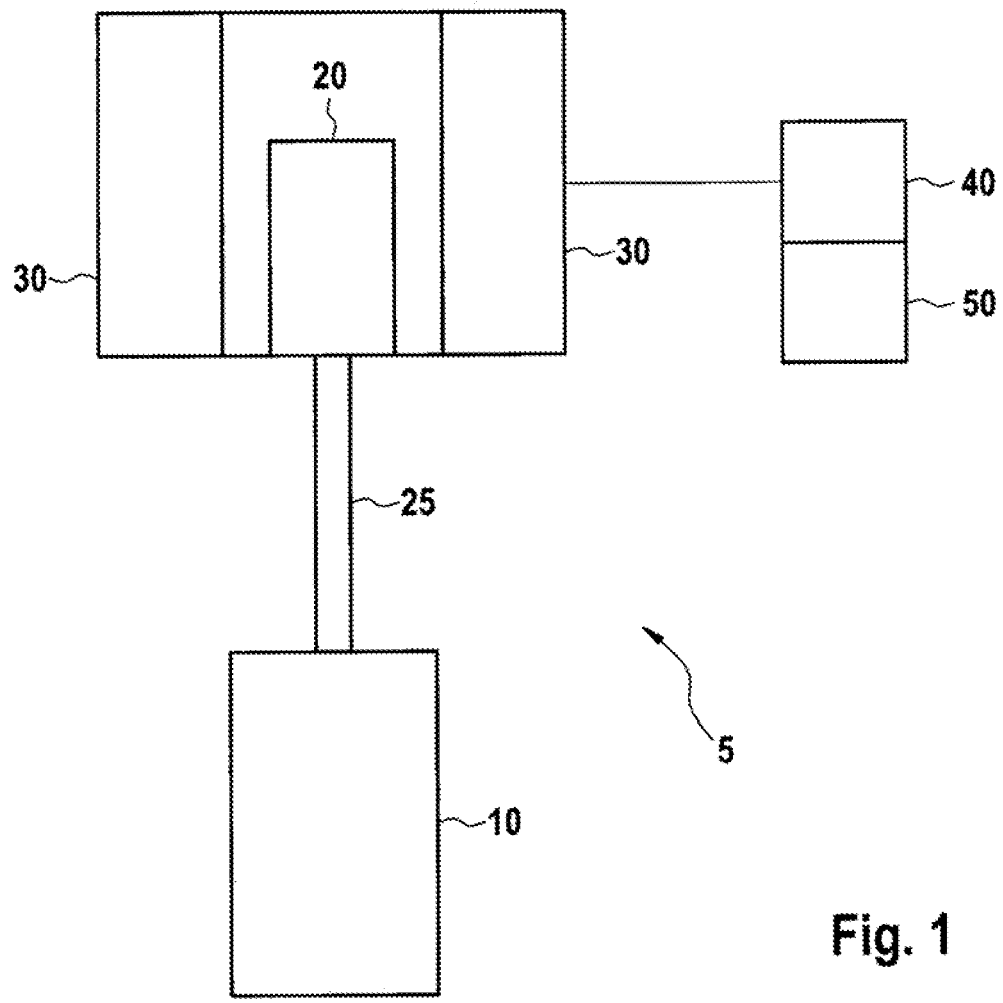
FIG. 1 shows a solenoid valve assembly.

FIG. 1 shows a solenoid valve assembly 5 according to an exemplary embodiment of the invention. This is configured to carry out a method according to an exemplary embodiment of the invention.

It should be understood that the solenoid valve assembly 5 is only shown schematically here.

The solenoid valve assembly 5 has a valve 10. It also has an armature 20, which is connected to the valve 10 via an armature rod 25. It also has a coil 30, which surrounds the armature 20. Electrical current can be applied to the coil 30, whereby the armature 20 can be moved. This allows movement or actuation of the valve 10. In particular, the valve 10 can be switched between two end positions, specifically an open end position and a closed end position.

The solenoid valve assembly 5 also has a control device 40, which is designed to apply a current and/or a voltage to the coil 30. This is for driving as just mentioned. In addition, the solenoid valve assembly 5 has a state determination device 50, which is configured to carry out a method according to an aspect of the invention. The functionality will be discussed in more detail below.

As already mentioned, the valve 10 is to be subjected to a switching state determination. For this purpose, a mathematical model of the electrical subsystem of the coil 30 will now be discussed before further details are described.

It should be understood that the mathematical details and formulas given below may also represent essential aspects that can also be used to restrict the claims.

A mathematical model of the coil 30 can be reproduced for the coil voltage u and the coil current i as well as the inductance L and the resistance R of the coil 30 in good approximation using the following relationship:

$$\frac{d}{dt}(L(i, x)i(t)) = u(t) - Ri(t). \tag{1}$$

Here, the time t is given as a parameter.

It should be noted that this equation also applies in the case of a pulse width modulation-operated current control. In this case, however, u means the average voltage of a pulse width modulation period and i means the average current of a pulse width modulation period.

Figure 2:
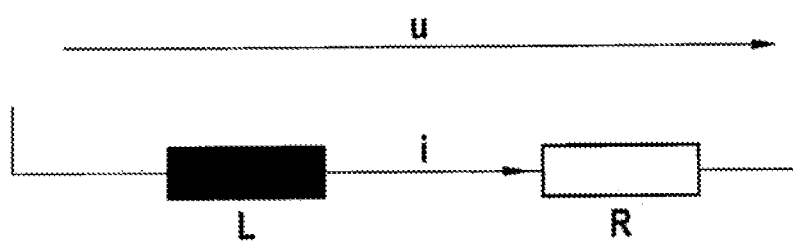
FIG. 2 shows an equivalent circuit diagram of a coil.

FIG. 2 shows an electrical equivalent circuit diagram, with inductance L, resistance R, voltage u and current i being shown.

Dynamic saturation effects play a subordinate role in typical systems and voltage ranges. Therefore, the above equation (1) can be simplified in good approximation to the following equation:

$$L(x, i)\frac{d}{dt}i = u - Ri - vi\frac{\partial}{\partial x}L(x, i). \tag{2}$$

Here, v denotes the tappet speed of a tappet, not shown separately, of the valve 10. For example, the tappet can be the already mentioned armature 20.

This mathematical model can be used to determine the valve state. This will be explained below.

Figure 3:
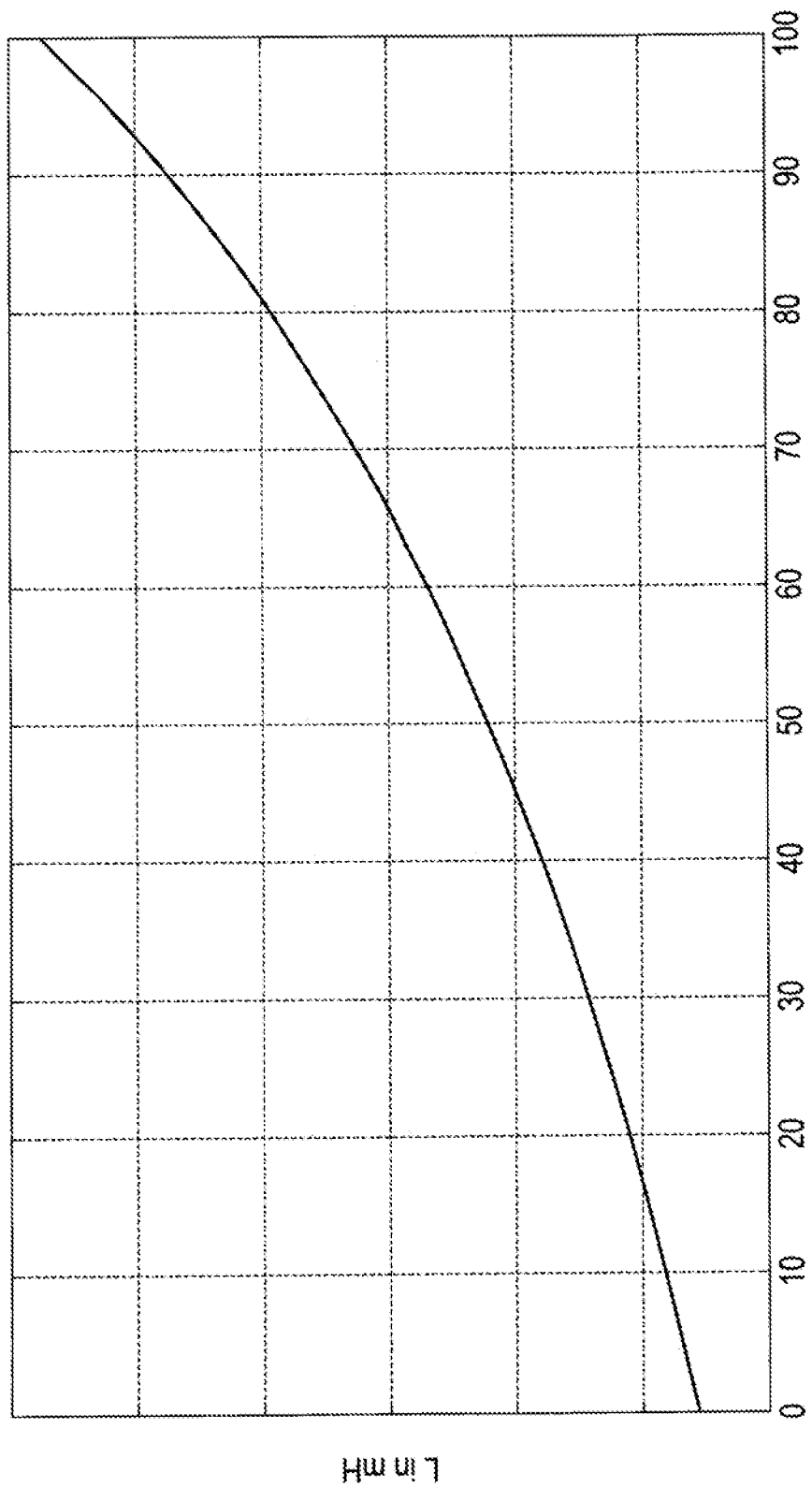
FIG. 3 shows an inductance in dependence on a valve position.
Figure 4:
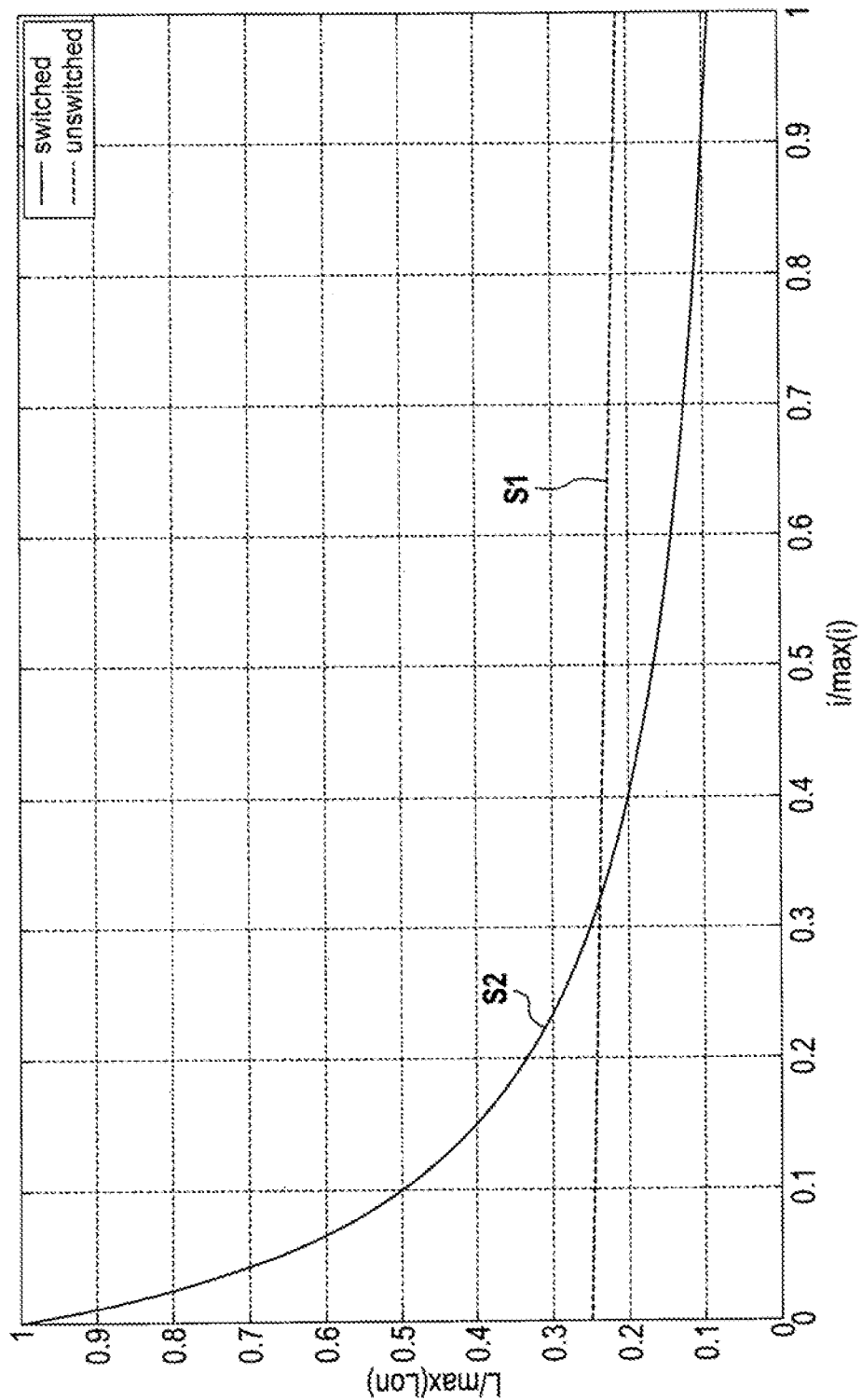
FIG. 4 shows an inductance in dependence on a current.

FIG. 3 shows a profile of the inductance with constant current against the tappet position of a typical solenoid valve, for example the valve 10. Furthermore, FIG. 4 shows a typical profile of the inductance against the current of an unswitched (x=0; reference symbol S1) and a switched (x=1; reference symbol S2) solenoid valve, for example of the valve 10. The switching state is shown in percent on the horizontal axis of FIG. 3, while the inductance is shown in arbitrary units on the vertical axis. The current is plotted relative to the maximum current on the horizontal axis in FIG. 4, while the inductance is plotted relative to the maximum inductance on the vertical axis in FIG. 4. It is easy to see that knowledge of the inductance and the current can be used to infer the switching state.

Since neither the tappet speed v nor the exact location dependency of the inductance L(x,i) is known, the estimation is however only easily possible when the valve tappet is not moving, i.e. when v=0 and L(x,i)=L(i) applies. This is at least always satisfied when the valve tappet is at one of the end stops.

If $L_0$=L(0,i0) denotes the inductance in the unswitched state and $L_1$=L(100,i100) the inductance in the switched state, in the event that the tappet is at one of the end stops then either the differential equation $$\frac{d}{dt}i = \frac{1}{L_0}u - \frac{R}{L_0}i \qquad (3)$$

or the differential equation $$\frac{d}{dt}i = \frac{1}{L_1}u - \frac{R}{L_1}i \qquad (4)$$

applies.

If there is a change in the current over time, the inductance L can be estimated, and thus the switching state can also be inferred directly by means of purely making comparisons of the size of the estimated inductance L with $L_0$ and $L_1$ and preferably also the knowledge of the current.

A method for inductance estimation is shown below.

If the voltage profile and current profile between two measuring points with the sampling time $T_s$ are approximated using a straight line, then the following relationship is obtained for the current profile between the sampling points $t_k$=$kT_s$ and $T_{k+1}$=(k+1)$T_s$:

$$i(t) \approx \frac{i_{k+1} - i_k}{T_s}(t - kT_s) + i_k, \quad t \in [t_k, t_{k+1}]. \qquad (5)$$

The voltage profile is obtained analogously. By then integrating the differential equation (3) for $L_0$=L using [$t_k$,$t_{k+1}$], together with equation (5), this then gives:

$$(i_{k+1} - i_k) = \frac{1}{L}T_s \frac{u_{k+1} + u_k}{2} - T_s \frac{R}{L}\frac{i_{k+1} + i_k}{2} \qquad (6)$$

or after a brief rearrangement $$\underbrace{(i_{k+1} - i_k)}_{=y} = \underbrace{[u_{k+1} + u_k, i_{k+1} + i_k]}_{=s^T} \underbrace{\begin{bmatrix} \frac{T_s}{2L} \\ \frac{T_s R}{2L} \end{bmatrix}}_{=p}. \qquad (7)$$

Thus, the determination of the parameters R, L is reduced to solving the linear least squares problem (7), and R, L can be determined from the substitute parameters p=[$p_1$,$p_2$]$^T$ in the form $$L = \frac{T_s}{2p_1} \qquad (8)$$

$$R = \frac{p_2}{p1}.$$

The idea of the valve state estimation is to solve the least squares problem recursively with a forgetting factor. This allows the inductance to be estimated in the event of changes in the current, from which the switching state can be determined by comparing the size. It should be noted that, because of the dependence of the inductance on the position, a change in current occurs not only as a result of a change in the coil voltage but also when there is a movement of the tappet, as is shown for example by equation (2) above. This also allows unwanted valve switching, for example due to externally acting forces or flow forces, to be detected.

It should be noted that a recursive method of least squares can also be implemented in fixed point arithmetic by suitable implementation. Furthermore, such a method has a very low computational effort for two estimation parameters, which also allows direct implementation in hardware by simple logic gates.

The calculation just described is carried out by the state determination device 50. For this purpose, the corresponding voltages and currents are measured at respective times.

Figure 5:
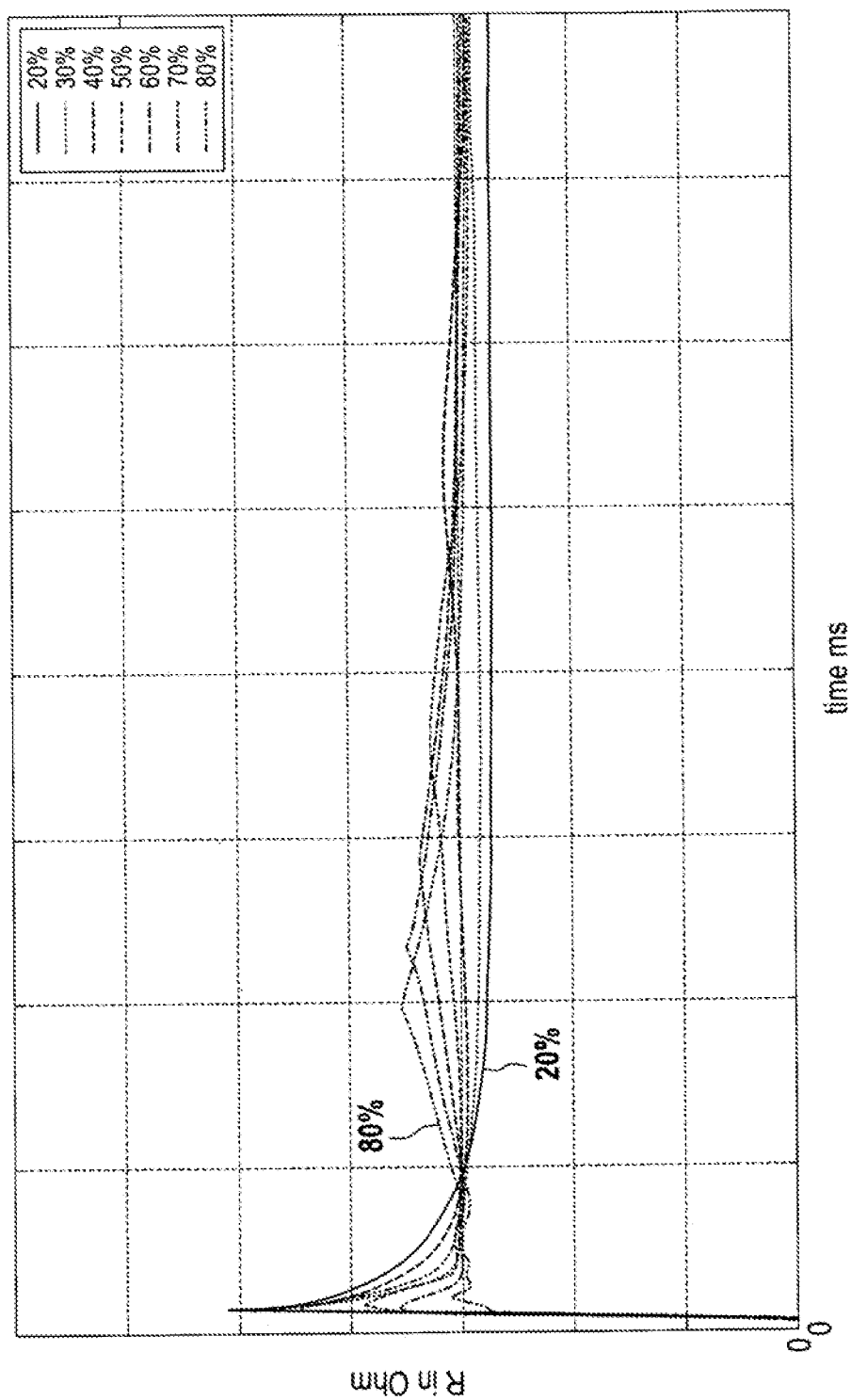
FIG. 5 shows a profile of a resistance and
FIG. 6 shows a profile of an inductance.
Figure 6:
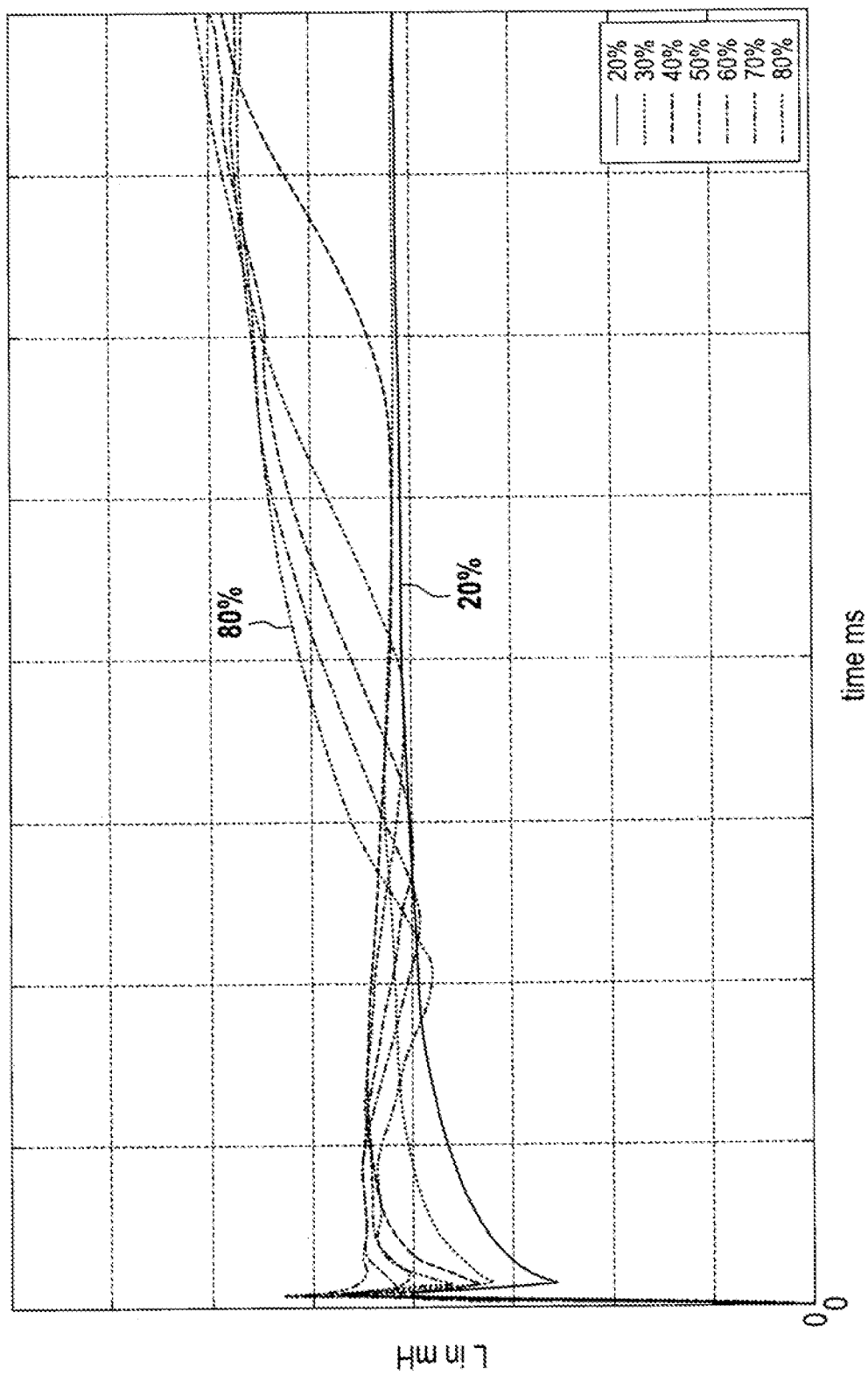

To validate the method, the duty cycles for a PWM-operated solenoid valve were set from 20% to 80% in 10% steps and at the same time the coil current averaged over the pulse width modulation period and the averaged coil voltage were measured. The algorithm described above was then applied to these voltage and current profiles. The resulting resistance and inductance profiles are shown in FIG. 5 (horizontal axis: time in arbitrary units; vertical axis: resistance in arbitrary units) and FIG. 6 (horizontal axis: time in arbitrary units; vertical axis: inductance in arbitrary units). It is easy to see that the algorithm for R and L converges after a short settling phase. It can also be seen from the profile of the inductance whether the valve closes or not. With a duty cycle of 20% and 30%, the current is insufficient to close the valve and the inductance values converge toward L0. With higher duty cycles, the current is sufficient to close the valve, which increases the inductance, which is detected very well by the estimate.

Up to now, the valve switching state dependent on the control was considered, i.e. it was assumed that a valve is switched when the controller requests it. It could not be ascertained whether a valve changes its switching state due to flow forces or other externally acting forces or whether for example a normally closed valve opens at all. There are already approaches to determining the switching state, but the resulting measurement signals are very small and prone to disturbance.

The estimation described above now makes it possible for the first time to make a precise and robust statement about the switching state of a digital valve. This means that functional safety requirements can be met better or for the first time. In addition, the fact that the state of the valve is known means that hydraulic safety measures such as check valves are not required. In contrast to already established methods, the resulting signals are rather large and, thanks to the filtering of the recursive least squares algorithm, not very sensitive to noise. In addition to the inductance, the algorithm also determines the current electrical resistance, almost as it were as a waste product. This can be used directly for availability issues.

The valve state estimation on the basis of the change in inductance is particularly advantageous. The use of the coil current and the coil voltage in connection with the mathematical model (3) or (4) as well as a suitable estimation method is decisive. For example, a recursive method of least squares can be used here, but other methods can also be used. Furthermore, the use of the coil current averaged over a pulse width modulation period and the averaged coil voltage is advantageous for systems operated by pulse width modulation. If the supply voltage is known, the duty cycle of a pulse width modulation period can also be used as an alternative to the averaged coil voltage.

The mentioned steps of the method according to an aspect of the invention may be carried out in the order given. However, they may also be carried out in a different order. In one of its embodiments, for example with a specific combination of steps, the method according to an aspect of the invention may be carried out in such a way that no further steps are carried out. However, in principle, further steps can also be carried out, even steps that have not been mentioned.

The claims which form part of the application do not represent a relinquishment of the attainment of further protection.

The invention claimed is:

1. A method for determining a switching state of a valve which is actuated by a coil, the method comprising:
respectively ascertaining a current flowing through the coil and a voltage applied to the coil at several times following one another with a specified time interval,
calculating an inductance variable of the coil on the basis of the currents, the voltage and the specified time interval, and
determining the switching state of the valve on the basis of the inductance variable of the coil,
wherein the inductance variable of the coil is compared with a first end value and a second end value,
wherein, when the inductance variable of the coil is at most a predetermined distance from the first end value, a first switching state is determined, and
wherein, when the inductance variable of the coil is at most a predetermined distance from the second end value, a second switching state is determined.

2. The method as claimed in claim 1, wherein the inductance variable of the coil is calculated using a method of least squares.

3. The method as claimed in claim 2,
wherein the method of least squares is used recursively with a forgetting factor.

4. The method as claimed in claim 1, wherein a resistance of the coil is also calculated on the basis of the current, the voltage and the specified time interval.

5. The method as claimed in claim 1,
which is executed continuously or continually repeatedly.

6. The method as claimed in claim 1, wherein the first switching state and the second switching state are end states of the valve.

7. The method as claimed in claim 1,
wherein the switching state of the valve is detected from a test signal.

8. The method as claimed in claim 1,
wherein calculations are carried out entirely or partly by fixed point arithmetic.

9. The method as claimed in claim 1,
wherein the coil is controlled by pulse width modulation,
wherein current and voltage are each averaged over a pulse width modulation period.

10. A solenoid valve assembly, comprising:
a valve,
a coil for actuating the valve,
a control device for applying a current and/or a voltage to the coil, and
a state determination device which is configured to carry out a method according to claim 1.

11. A method for determining a switching state of a valve which is actuated by a coil, the method comprising:
respectively ascertaining a current flowing through the coil and a voltage applied to the c oil at several times following one another with a specified time interval,
calculating an inductance variable of the coil on the basis of the currents, the voltage and the specified time interval, and
determining the switching state of the valve on the basis of the inductance variable of the coil,
wherein the inductance variable of the coil is ascertained by a linear equation, in which a first column vector is set equal to a matrix multiplied by a second column vector,
wherein the times are numbered with index k,
wherein the first column vector contains in row k a difference between the current at time k+1 minus the current at time k,
wherein the matrix has two columns,
wherein the first column of the matrix contains in row k a sum of the voltage at time k+1 and the voltage at time k,
wherein the second column of the matrix contains in row k a sum of the current at time k+1 and the current at time k, and
wherein the second column vector contains a first parameter in its first row and a second parameter in its second row.

12. The method as claimed in claim 11, wherein the inductance variable of the coil is calculated as a quotient of the specified time interval divided by the number two and divided by the first parameter.

13. The method as claimed in claim 11, wherein a resistance of the coil is calculated as a quotient of the second parameter divided by the first parameter.

* * * * *

UNITED STATES PATENT AND TRADEMARK OFFICE
CERTIFICATE OF CORRECTION

| | | |
|---|---|---|
| PATENT NO. | : 11,940,059 B2 | Page 1 of 1 |
| APPLICATION NO. | : 17/284920 | |
| DATED | : March 26, 2024 | |
| INVENTOR(S) | : Alexander Michel, Dirk Morschel and Eduard Wiens | |

It is certified that error appears in the above-identified patent and that said Letters Patent is hereby corrected as shown below:

In the Claims

In Column 7, Line 38 in Claim 1 the word "currents," should read -- current, --.

In Column 8, Line 25 in Claim 11 the word "c oil" should read -- coil --.

In Column 8, Line 28 in Claim 11 the word "currents," should read -- current, --.

Signed and Sealed this
First Day of April, 2025

Coke Morgan Stewart
*Acting Director of the United States Patent and Trademark Office*